(12) United States Patent
Adams et al.

(10) Patent No.: US 6,888,413 B1
(45) Date of Patent: **\*May 3, 2005**

(54) FREQUENCY SYNTHESIZER USING A VCO HAVING A CONTROLLABLE OPERATING POINT, AND CALIBRATION AND TUNING THEREOF

(75) Inventors: Andrew R. Adams, Stanmore (AU); Neil H. Weste, Castle Hill (AU); Stephen C. Avery, Kellyville (AU)

(73) Assignee: Cisco Systems Wireless Networking (Australia) Pty Limited, North Sydney (AU)

( * ) Notice: Subject to any disclaimer, the term of this patent is extended or adjusted under 35 U.S.C. 154(b) by 0 days.

This patent is subject to a terminal disclaimer.

(21) Appl. No.: 10/731,924

(22) Filed: Dec. 9, 2003

Related U.S. Application Data

(63) Continuation of application No. 10/096,215, filed on Mar. 11, 2002, now Pat. No. 6,686,804, which is a continuation-in-part of application No. 09/952,925, filed on Sep. 14, 2001, now Pat. No. 6,512,419.
(60) Provisional application No. 60/283,609, filed on Apr. 13, 2001, and provisional application No. 60/277,370, filed on Mar. 19, 2001.

(51) Int. Cl.$^7$ ................................................. H03L 7/00
(52) U.S. Cl. .......................... 331/17; 331/16; 331/179; 327/105; 327/107
(58) Field of Search ................................ 327/156, 157, 327/159, 105, 107; 331/14, 15, 17, 16, 177 V, 179

(56) References Cited

U.S. PATENT DOCUMENTS

| | | | |
|---|---|---|---|
| 6,211,745 B1 * | 4/2001 | Mucke et al. | 331/117 R |
| 6,512,419 B1 | 1/2003 | Adams et al. | 331/17 |
| 2003/0022646 A1 * | 1/2003 | Bult et al. | 455/232.1 |

* cited by examiner

*Primary Examiner*—Tuan T. Lam
(74) *Attorney, Agent, or Firm*—Dov Rosenfeld; Inventek

(57) ABSTRACT

A frequency synthesizer, a calibrator thereof, and an operating controller thereof are described. The synthesizer comprises a main charge pump that drives a voltage controlled oscillator (VCO) through a loop filter. The calibrator includes a second, replica charge pump that can also drive the VCO, but is set up to output only its maximum or minimum analog output control voltage. Since the construction and characteristics of the replica charge pump duplicate the main charge pump, the main charge pump's minimum and maximum analog control outputs can be cloned out to the VCO on demand. A VCO calibration procedure therefore includes switching the VCO to each of its ranges set by a bank of fixed capacitors, and using the replica charge pump to drive the VCO to its minimum and maximum frequency for each range setting. The min-max frequency data is stored in a lookup table, and operational requests to switch to a new channel frequency can be supported with a priori information about which fixed-capacitor range selection will be best. The operating point controller includes a sensor to sense the operating point and a controller that provides a switching input to a switchable bank of capacitors to change the operating point. The change can be determined according to calibration data.

4 Claims, 7 Drawing Sheets

FREQUENCY SYNTHESIZER USING A VCO HAVING A CONTROLLABLE OPERATING POINT, AND CALIBRATION AND TUNING THEREOF

RELATED PATENT APPLICATIONS

This invention is a continuation of U.S. patent application Ser. No. 10/096,215 field Mar. 11, 2002 now U.S. Pat. No. 6,686,804 to inventors Adams, et al.

U.S. patent application Ser. No. 10/096,215 is a continuation-in-part to U.S. patent application Ser. No. 09/952,925 now U.S. Pat. No. 6,512,419 filed Sep. 14, 2001 and entitled METHOD AND APPARATUS TO TUNE AND CALIBRATE AN ON-CHIP OSCILLATOR IN A WIRELESS TRANSCEIVER CHIP, to U.S. patent application Ser. No. 09/952,925 claimed the benefit of two United States provisional patent applications. The first is Ser. No. 60/277,370, filed Mar. 19, 2001, and titled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH. The second is Ser. No. 60/283,609, filed Apr. 13, 2001, and titled WIRELESS COMMUNICATION SYSTEM.

BACKGROUND

The present invention relates generally to voltage controlled oscillators (VCOs) for phase lock loop frequency synthesizers, and in particular to calibrating and tuning a VCO, and including operating point control for the VCO.

Conventional phase-locked loops (PLLs) are used in prior art circuits to synthesize local oscillator frequencies used in radio receivers. The most common type of PLL uses a VCO that depends on a varactor for tuning. But inexpensive varactor diodes cannot be used in PLLs that need to be tuned over very large frequency ranges.

A typical prior-art VCO is shown in FIG. 1 in a phase locked loop configuration and given reference numeral 100. The VCO constant denoted $K_v$ is the slope of the frequency vs. control voltage curve, and when an attempt is made to tune a varactor controlled VCO, the required VCO constant is too large or the capacitance variation required becomes unachievable and the PLL has trouble locking. Such circuits, when they do lock, are very sensitive to digital noise, because a relatively small noise voltage is translated into a relatively large frequency perturbation. For example, in a 1.8-volt system needing a one-gigahertz tuning range, a VCO constant of 1 G Hz/volt would be far too large to be practical for use in a PLL with a loop bandwidth consistent with practical 802.11a radio operation.

In general, a smaller VCO constant will result in reduced phase noise. To keep the VCO constant relatively low, yet achieve a large tuning range, one prior art tuning method includes switching in and out fixed capacitors and using the varactors to tune between the frequencies of only the fixed capacitors. A one gigaHertz tuning range, for example, would be implemented in ten 100 MHz subranges, with the VCO constant of 100 MHz/volt, achieving a twenty dB reduction.

Unfortunately, with mass-produced semiconductor devices such switched fixed capacitors vary with manufacturing process spread and with operating temperatures. So a calibration method and circuit are needed that can reduce the frequency uncertainties that would otherwise be introduced into PLL and VCO applications. Better yet, a built-in calibration method could help in obtaining a longer, more reliable product life.

It is desired to have an inexpensive VCO for a mass produced device, for example using CMOS technology. It is very difficult to make good quality VCOs in CMOS; the inductor Q's, for example, are very poor. Therefore it is important that all other factors that contribute to phase noise are significantly reduced, the VCO constant being one of them. The VCO constant affects the loop dynamics of a PLL that uses the VCO, such as the phase margin and loop bandwidth of the PLL.

One desirable property of a VCO is that the VCO constant not only be kept reasonably low, but also stable and known.

FIG. 2 shows the frequency vs. control voltage curve for a fictional "ideal" VCO. The curve is a straight line over a large frequency range, so that $K_v$ is constant. FIG. 2 also shows what a frequency vs. control voltage curve looks like for a fictional prior-art CMOS VCO with no operating point control. The curve is not linear, but "S-shaped." The slope of the curve varies with frequency, and such a variation is shown, by way of example, in FIG. 3. Furthermore, the frequency vs. control voltage curve itself varies with temperature, leading to drift in the free running frequency. Furthermore, the frequency vs. control voltage also varies from device to device, particularly when using inexpensive technology such as CMOS. Because of these and other effects, one cannot predict where the operating point, i.e., the point of the lock up of the PLL, will be.

Thus there is a need to provide a control mechanism to ensure that the operating point of the VCO is close to a desirable operating point.

SUMMARY OF THE INVENTION

An object of the present invention is to provide a voltage controlled oscillator with a relatively large frequency swing having an output in the gigaHertz range.

Another object of the present invention is to provide a calibration method for a VCO in a mass-produced semiconductor device, e.g., a CMOS device.

Another object of the present invention is to provide a method and an apparatus for controlling the operating point of a VCO used in a PLL frequency synthesizer.

A further object of the present invention is to provide a PLL frequency synthesizer circuit that includes a control mechanism to control the operating point of the VCO.

A further object of the present invention is to provide a wireless radio oscillator circuit.

Briefly, a frequency synthesizer calibrator embodiment of the present invention comprises a main charge pump that drives a voltage-controlled oscillator (VCO) through a loop filter. A second, replica charge pump can also drive the VCO, but is set up to output only its most positive or most negative analog output control voltage. Since the construction and characteristics of the replica charge pump duplicate the main charge pump, the main charge pump's minimum and maximum analog control outputs can be cloned out to the VCO on demand. A VCO calibration procedure therefore includes switching the VCO to each of its ranges set by a bank of fixed capacitors, and using the replica charge pump to drive the VCO to its minimum and maximum frequency for each range setting. The min-max frequency data is stored in a lookup table, and operational requests to switch to a new channel frequency can be supported with a priori information about which fixed-capacitor range selection will be best.

Furthermore, one embodiments includes a sensor to sense the operating point of a VCO in a PLL configuration by sensing the input control voltage, and a controller that provides a switching input to a switchable bank of capacitors to change the operating point such the at VCO is maintained close to a desired operating point. The change can be determined according to calibration data.

The above and still further objects, features, and advantages of the present invention will become apparent upon consideration of the following detailed description of specific embodiments thereof, especially when taken in conjunction with the accompanying drawings.

DETAILED DESCRIPTION OF THE INVENTION

Figure 4:
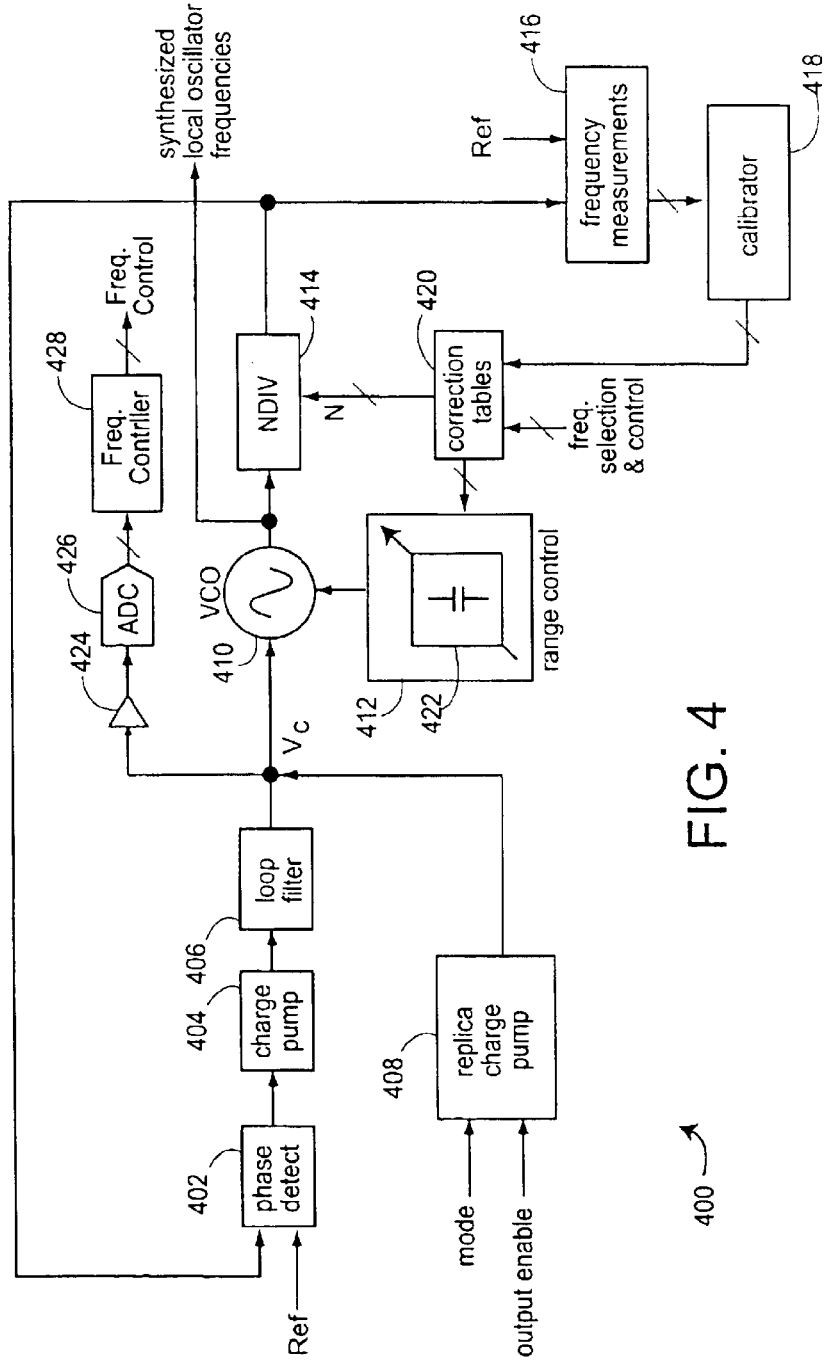
FIG. 4 is a functional block diagram of a PLL frequency synthesizer embodiment that includes the calibration of the present invention and the operating point control of the present invention.

FIG. 4 represents a frequency synthesizer embodiment of the present invention that includes calibration and operating point control, and is referred to herein by the general reference numeral 400. The frequency synthesizer 400 is typically used as a local oscillator in wireless device applications that operate in the 5.0+GHz spectrum, e.g., the PHY-layer in IEEE-802.11 a wireless local area networks. One embodiment of the present invention uses a voltage controlled oscillator (VCO) and includes a switch bank of fixed capacitors to extend and stabilize the VCO tuning range. An uncertainty results in what range of VCO tuning frequencies will result for each selected fixed capacitor in parallel with the relatively small-value continually variable varactor. One embodiment of the present invention builds one or more calibration tables off-line using a clone charge pump and frequency measurement. Such a replica charge pump duplicates the performance of the main-service charge pump because it is constructed the same way on the same chip, and is subjected to the same conditions of current, voltage, and temperature, and to the same semiconductor process and variations.

The frequency synthesizer 400 operates in a phase locked loop (PLL) that includes a phase detector 402 that compares a reference frequency (signal "Ref") to a feedback sample frequency. Any differences in phase or frequency generate a digital correction signal that is sent to a main-service charge pump 404. The charge pump converts this to an analog control signal, e.g., a current. Such current is converted to a voltage and filtered by a loop filter 406. A replica charge pump 408 is provided for calibration. A variable-voltage voltage control signal is applied by both charge pumps to a voltage-controlled oscillator (VCO) 410. A bank of fixed-value capacitors is included in a range control 412 and will dictate the basic frequency operating range of the VCO 410 in several steps.

Within each such step, the VCO output frequency can be varied by the input control voltage from the charge pumps. In fact, the result is several overlapping steps that give continuous coverage over the entire frequency-output operating range of VCO 410. The basic problem solved by one embodiment of the present invention is the determination of which fixed-value capacitors included in range control 412 should be selected to obtain a particular frequency synthesizer operating frequency. Integrated capacitor, process, temperature, operating voltage, and other device variables can make the points at which the steps transition from one frequency to the next unknown. Such points may also change over time and not be consistent within manufacturing runs from unit to unit. Another aspect of the invention is the control of the VCO so that the VCO operates close to a desired operating point.

The main charge pump 404 is typically connected between power-supply rails. Such power supply voltages limit the minimum and maximum output swings that can be generated by main charge pump 404 at the input of VCO 410. The electronic construction and semiconductor process variations of main charge pump 404 also affect the minimum and maximum output swings that can be generated by main charge pump 404. In one embodiment, the charge pump output current is programmable, so the minimum and maximum charge pump voltages achievable are dependent upon the selected charge pump current due to finite FET on-resistance. It is therefore desirable that the calibration be carried out with the same replica charge pump current setting as is used in the main charge pump. The operating temperature will also have some effect on frequency and the operating point. But it is desirable to know the minimum and maximums, at least indirectly, because they affect the operational points at which the VCO range steps transition from one frequency to the next.

It was decided that including controls on the main charge pump 404 that would artificially drive it to its minimum and maximum output values would be impractical and not particularly effective. A much simpler solution is to try to duplicate the basic charge pump circuitry with a replica e.g., replica charge pump 408, that may be different in some respects, but will in general mimic the operational behavior of the main charge pump, at least at the maximum and minimum control points. The replica charge pump 408 can then be relied on to mimic the operational behavior of the main charge pump, at least at the maximum and minimum control points.

Since in one embodiment, only the minimum and maximum output values are of interest, the replica charge pump 408 does not require a phase detector or reference frequencies and its output need not pass through the loop filter. Thus, in one embodiment, the replica charge pump is connected to the control input of the VCO that is connected to the output of the loop filter. A mode control simply causes either the minimum or maximum to be output. An output enable allows the replica charge pump 408 to be tristated from the VCO input, e.g., so its capacitance doesn't load the output of the loop filter 406 after calibration, i.e., the replica charge pump 408 may be turned "on" for some calibration tasks, or "off" during normal operation.

The VCO 410 has a frequency output that depends on both the analog control voltage and a fixed-capacitor set selection of the range control. A voltage-variable-capacitance varactor in the VCO 410 is combined with a number of fixed capacitors to continuously bridge a tuning gap between successive fixed capacitor selections. The actual continuous tuning range effect of the charge pump 404 on the VCO 410 has some uncertainties, and which particular fixed-capacitor set needs to be selected in range unit 412 for a particular radio channel frequency is consequently uncertain too.

The VCO 410 produces a synthesized frequency output that is stabilized to the reference frequency by the phase locked loop configuration (PLL 400). The PLL 400 includes a programmable divide-by-N circuit 414 that in one embodiment uses a programmable digital counter. A variety of synthesized frequencies can be output because as the division number "N" is changed, the VCO 410 will slew in frequency so the two inputs at the phase detector 402 will match. In other words, "N" is one of the factors that dictate the output frequency.

During calibration, the replica charge pump 408 is enabled (turned "on") and a frequency measurement unit 416 samples the output of VCO 410, in one embodiment in relation to the reference frequency. These measurements are taken for each minimum and maximum for each fixed-value capacitor selection possible in range unit 412. A calibrator 418 implemented in one embodiment by software running on an on-chip microcontroller (not shown here) controls the range selections, the manipulations of replica charge pump 408, and stores the data in a correction table 420 that in one embodiment is in a memory connected to the microcontroller.

After calibration, a channel selection request indexes a lookup table in correction tables 420 and drives an appropriate value of "N" to the divider 414 and the proper capacitor combination selection to range unit 112.

In general, one embodiment of the calibration aspects of the present invention includes a selectable bank of fixed capacitors that is operated to change the VCO range. A set of correction tables is generated for converting particular radio channel selections into a correct fixed-capacitor set choice. For example, some radio channel selections could be at points near the frequency break between two successive fixed-capacitor set choices. In one instance, the varactor would be operated near its high-end voltage limit, and in the other instance of fixed-capacitor selection the varactor would be run down to near its minimum voltage limit.

Figure 5:
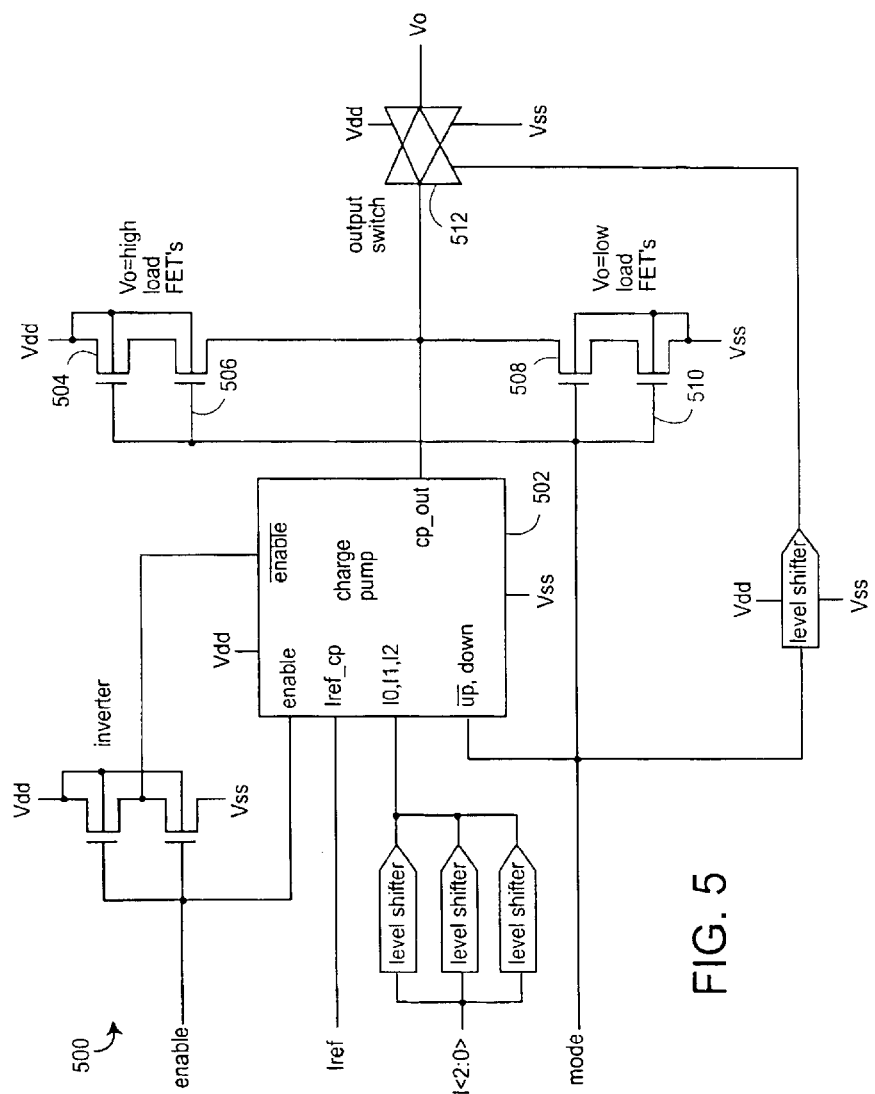
FIG. 5 is a functional block diagram of a replica charge pump embodiment of the present invention, and is similar to the replica charge pump shown in FIG. 4.

FIG. 5 represents a replica charge pump 500 that could be used as replica charge pump 408 in FIG. 4. The supply rails are denoted Vdd and Vss. The replica charge pump 500 includes a charge pump device 502 that is electronically constructed the same as main charge pump 404 in FIG. 4. It also is subjected to the same operating conditions, e.g., by being integrated on the same chip and powered by the same supply rails. A pair of load FETs 504 and 506 mimic the DC loads placed on the output of main charge pump 404 and loop filter when the voltage output (Vo) is high. Another pair of load FETs 508 and 510 mimic the DC loads placed on the output of main charge pump 404 when the voltage output (Vo) is low. A tri-state output switch 512 allows the replica charge pump 500 to be offloaded from the external output load.

Figure 6:
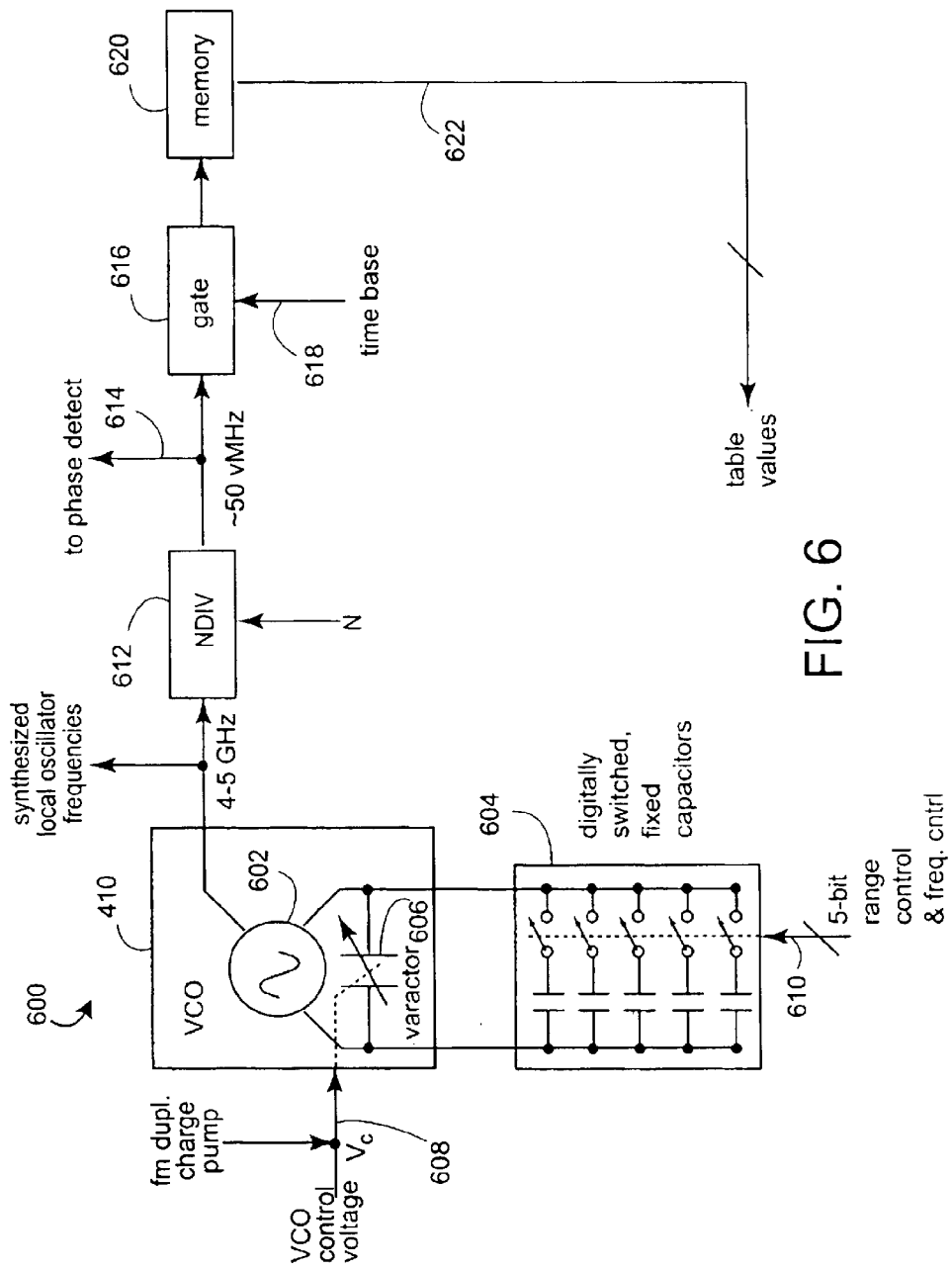
FIG. 6 is a functional block diagram of a voltage-controlled oscillator as used in the local oscillator of FIG. 4 and as driven by the charge pump of FIG. 5.

FIG. 6 diagrams a voltage-controlled oscillator (VCO) calibrator embodiment of the present invention, and is referred to herein by the general reference numeral 600. The VCO calibrator 600 comprises an oscillator 602 that outputs a frequency dependent on a digitally controlled fixed-capacitor bank 604 and a varactor diode 606. A VCO control voltage 608, e.g., from a charge pump, and a 5-bit range control 610 dictate what frequency will be output. The output "fO" is also the input to a programmable divider 612 provides, and in one embodiment is in the 4–5 GHz range. The output of the divider is a sample signal output 614 to a digital gate 616. A time base 618 allows a gating interval number of clock pulses that can pass through in a base measurement time period. These pulses are counted and stored in a digital memory 620. In one embodiment, the gating interval is a function of the reference frequency $f_{ref}$. A number of measurements are taken at a variety of capacitor combinations of range control 610 and the minimum and maximum VCO control voltages 608. Such measurements are stored in a lookup table and made available post-calibration in a signal 622.

The operational assumption is that the output frequency $f_o$ will repeat its measured value that was taken during calibration, and that restoring the corresponding 5-bit range control will provide an initial fixed value of capacitance from capacitor bank 604 that will allow frequency lock within range of the VCO control voltage 608. One embodiment uses sixty-four such measurements and corresponding table lookup entries.

In one embodiment, a translation of radio-channels, for example, to measured frequency table values is preferably executed in software during operation on an included microcontroller. The translation is then available for use as 5-bit range control signal 610. In general, the 5-bit range control value associated with the VCO control voltage 608 at minimum is preferred over the corresponding one at maximum.

In another embodiment, the 5-bit control is also used to control the operating point of the VCO, as described in more detail below.

In alternative embodiments of the present invention, the calibration measurements are taken at a variety of temperatures as monitored by an on-chip temperature sensor. The translation software then preferably finds the set that has the closest calibration temperature for current operating conditions.

In an alternative embodiment of the present invention, a replica charge pump is used to find the center frequency of the range afforded by each fixed capacitor. Such center frequency is measured, and then stored in a look up table together with a calibration value that represents current conditions, e.g., temperature. Otherwise, the value stored could be normalized for the current conditions. During normal operation, the selecting of a channel/frequency includes looking up the capacitor that is appropriate to use. The tuning response and voltage/temperature effects from a normalized table can affect the capacitor choice. If there is sufficient overlap between frequency ranges, and some safety factor is included, an accurate selection can be made based on all process and environmental factors. Such a method would never have to measure the frequencies resulting from the minima and maxima control voltages.

In general, embodiments of the present invention log predetermined points in the tuning range using the replica charge pump. On-the-fly frequency calculations can be made from previously measured data, and result in an accurate fixed-capacitor choice.

Another aspect of the present invention is providing control to ensure that the operating point of the VCO remains close to a desired operating point. For mass produced VCOs, for example ones fabricated in CMOS technology, the VCO constant $K_v$ varies from chip to chip, and furthermore is not constant over a large frequency range, i.e., a large control voltage range. Because $K_v$ affects the loop dynamics of a PLL that uses the VCO, such as the phase margin and loop bandwidth of the PLL, such variations are undesirable.

Figure 1:
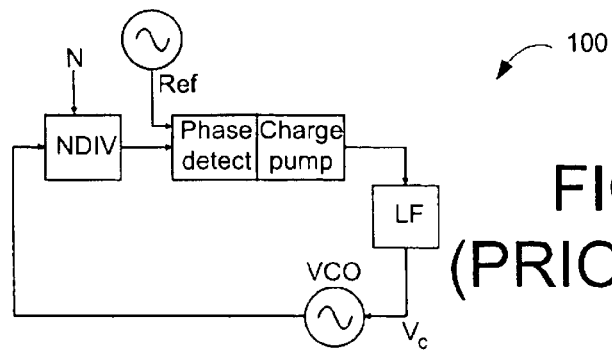
FIG. 1 shows a prior-art VCO in simplified form.
Figure 2:
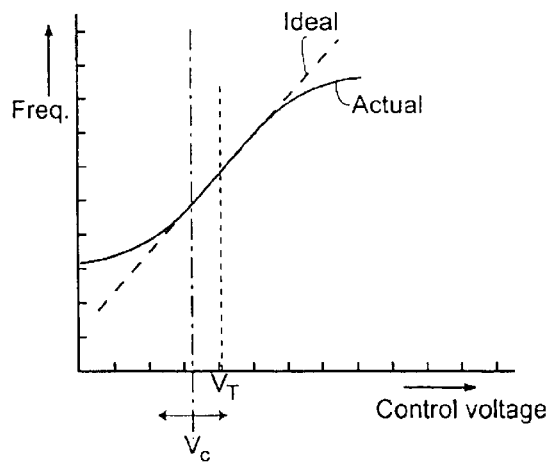
FIG. 2 shows in simplified form the frequency vs. control voltage characteristics of an ideal VCO, and also of how a real-life VCO might veer from the ideal.
Figure 3:
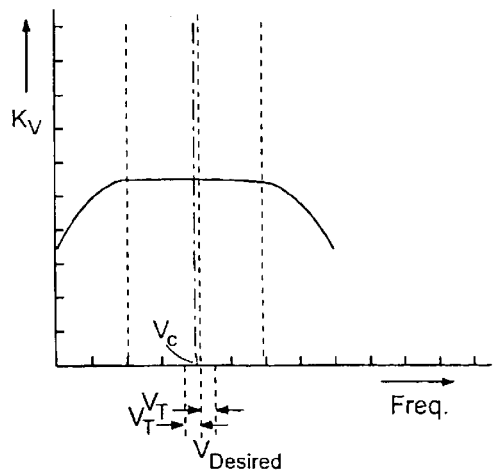
FIG. 3 shows in simplified form the VCO constant vs. control voltage characteristics of a potential real-life VCO.

FIG. 2 shows what a fictional frequency vs. control voltage curve looks like for a fictional prior-art CMOS VCO with no control. As in a real CMOS VCO, the curve is not linear, but "S-shaped." The slope of the curve varies with frequency, and such a variation is shown, by way of example, in FIG. 3. Furthermore, the curve varies from device to device. Furthermore, the curve varies with operating temperature. Because of these and other effects, one cannot predict where on the S-curve one will lock up.

Referring again to FIG. 4, PLL 400 includes a control mechanism to control the operating point. It is desirable to keep the operating point, shown as a control input voltage $V_C$, close to a desired operating point, denoted by $V_{desired}$ (see FIGS. 2 and 3). It is also desirable that $V_{desired}$ is in an adjustable controlled range.

The control mechanism includes a circuit to monitor the control voltage, in one embodiment using a sense amplifier shown as amplifier 424. The monitored voltage from the sense amplifier is used in a controller to produce a control signal to control the range controller 412, in particular its switched capacitor bank 422. In one embodiment, the controller is a digital controller 428 implemented in software on an on board microcontroller—the same microcontroller that is used for the calibrator in an embodiment that includes the calibrator. The output of the controller is combined with the channel selection request that indexes a lookup table in correction tables 420 and drives an appropriate value of "N" to the divider 414 and the proper capacitor combination selection to range unit 412. An on-chip analog-to-digital converter (ADC) 426 converts the output of the sense amplifier 424 to a digital value that is used by the digital controller 428. The digital controller includes a function of the desired operating voltage $V_{Desired}$. In one embodiment, the controller includes a settable threshold voltage $V_T$. A comparator function in the controller indicates when the magnitude of the difference between the desired and actual control voltage, $|(V_c - V_{Desired})|$ exceeds the threshold VT. When this occurs, the output of the controller causes the range controller to adjust capacitor bank.

Thus, the operating point of the VCO is maintained close to the desired operating point that typically is selected to be around the center of the region where the VCO characteristics are approximately linear, so $K_v$ is approximately constant.

In one embodiment, the adjustment to maintain the operating point close to $V_{Desired}$ is carried out only periodically, for example every hour so that a timer and a threshold triggers the correction.

Figure 7:
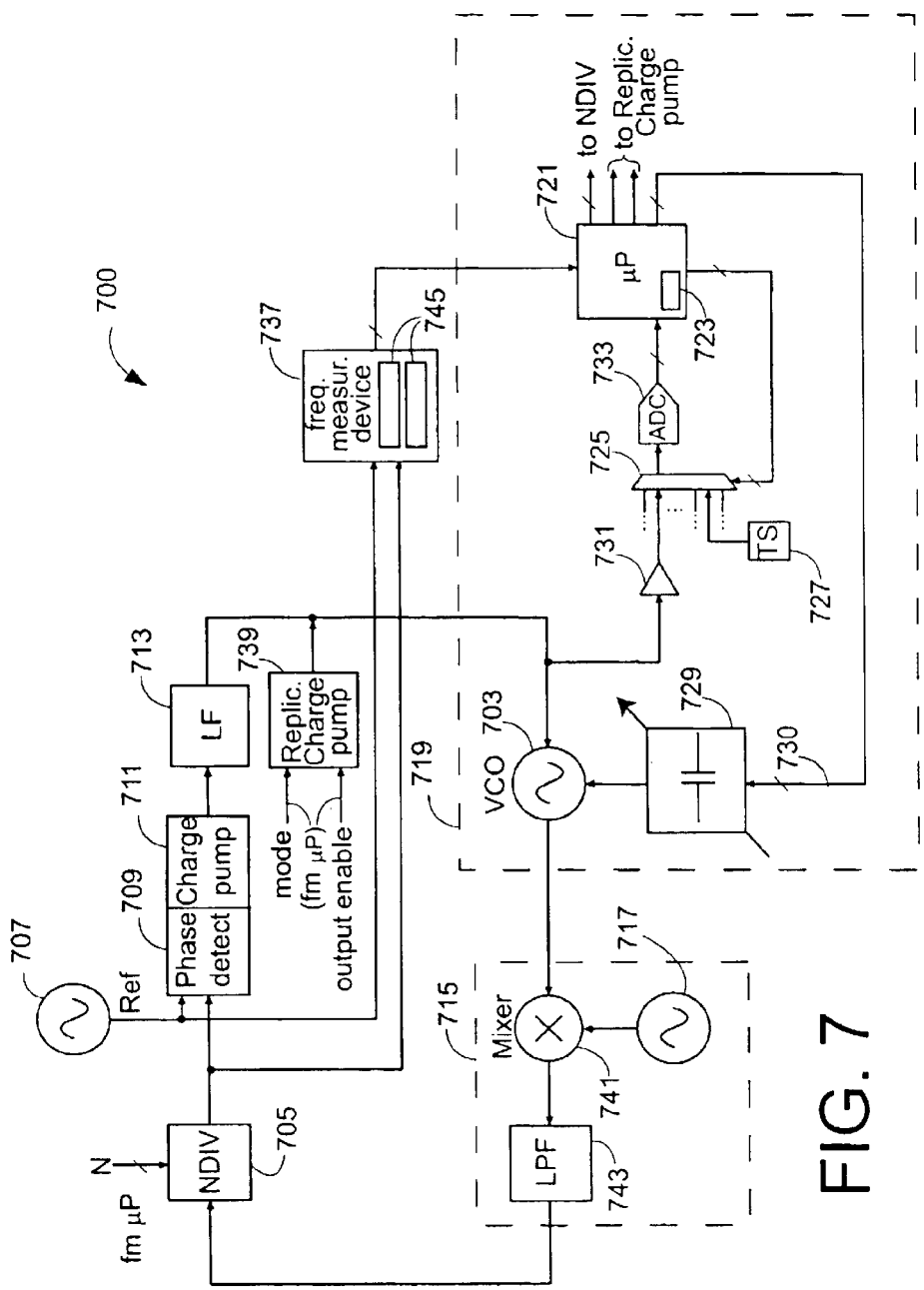
FIG. 7 shows a functional block diagram of another embodiment of a PLL frequency synthesizer.

FIG. 7 shows another embodiment of a PLL shown as reference numeral 700. PLL 700 includes in its feedback loop a VCO 703, a digitally programmable divider 705, a phase detector 709 to compare the phase of the output of the programmable divider to that of a reference oscillator 707, a charge pump 711, and a loop filter 713. The programmable divider provides slightly different frequencies, e.g. frequency channels. The output of the programmable divider may be used to drive other circuits, e.g., to provide a local oscillator to a wireless transceiver. In order to reduce the frequency at which the programmable divider needs to operate, the prior art often uses a fixed pre-scaler between the voltage controlled oscillator 703 and programmable divider 705. Such a pre-scaler may replace the element shown as 717 (note that PLL 700 would in that case still not be prior art because it includes novel calibration and operating point control). The overall divide ratio, however, is high. So, with such a fixed pre-scaler circuit, it may be difficult to achieve both fine frequency control using the programmable divider, and have reasonable phase-noise performance. U.S. patent Application Ser. No. 60/322,575, entitled OFFSET MODE PHASE LOCKED LOOP FREQUENCY SYNTHESIZER WITH REDUCED DIVIDE RATIO, filed Sep. 14, 2001, assigned to the assignee of the present invention, and incorporated herein by reference, describes replacing the fixed pre-scaler with a mixer and a second local oscillator. PLL 700 of FIG. 7 includes such an offset mechanism 715 that comprises a second local oscillator 717, a mixer 741 and a low-pass filter 743. Using the second local oscillator and the mixer does not affect the in-loop bandwidth noise in the same manner as does a circuit that uses a fixed pre-scaler.

Embodiments of the invention that include the offset mechanism may include one or both of calibration and operating point control; PLL 700 is shown including both. A replica charge pump 739 provides test signals for calibration, and is controlled by a microcontroller 721 that incorporates the function of the calibrator 418 and the correction table 420. A frequency measurement device 737 is included to provide an indication of frequency to the microcontroller. In one embodiment, the frequency measurement device 737 includes a pair of counters that respectively count the outputs of the programmable divider 705 and the reference source 707 and provide to the microcontroller 721 an indication of the frequency of the PLL output. e.g., the divider output relative to that of the reference source. The microcontroller 721 includes a memory 723 in which are built the correction tables 420. The microcontroller controls the replica charge pump shown as 739 for when calibration and the associated frequency measurements occur. The range controller that includes the capacitor bank is shown as element 729 and is controlled by a digital signal 730 from the microcontroller. The programmable divider is also controlled by the microcontroller 721.

The VCO operating point control elements 703 include a sense amplifier 731 and an ADC 733. The ADC provides a digital signal to the microcontroller that in turn controls the range controller and programmable divider to maintain the operating point close to a desired operating point.

PLL 700 also includes a temperature sensor 727 that is on the same chip, and thus provides an indication of the temperature of the device. The output of the temperature sensor 727 is digitized by the same ADC 733 to provide the microcontroller 721 with an indication of the on-temperature. A selector 725 is included between the ADC 733 and both the sense amplifier 731 and the temperature sensor 727 to select, under control of the microcontroller 721 what signal is being digitized by the ADC.

In one embodiment, the temperature sensor is used to trigger a calibration. That is, whenever the temperature drifts by a settable temperature threshold, a frequency measurement cycle is started and calibration is carried out. In one embodiment, a temperature drift also starts a VCO operating control cycle.

Figure 8:
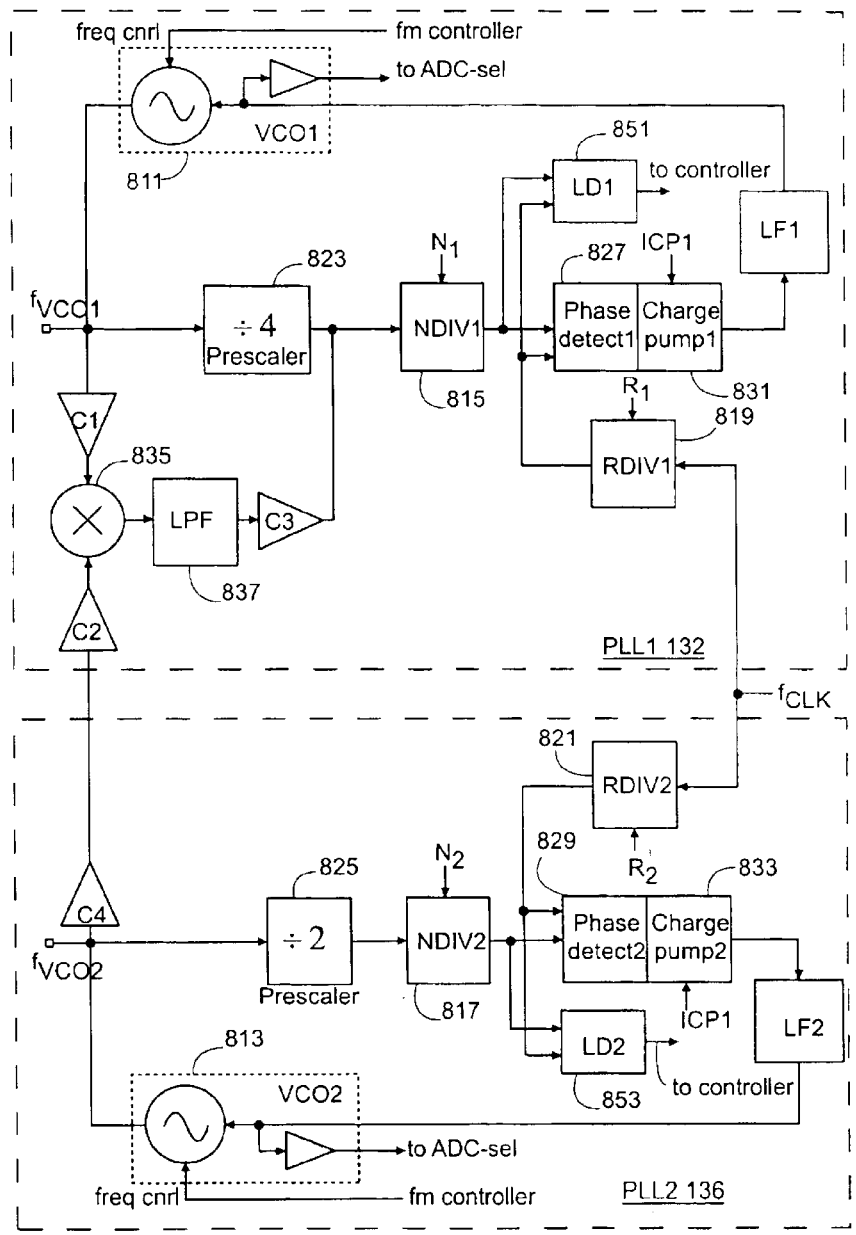
FIG. 8 shows two frequency synthesizers PLL1 and PLL2 that can generate high- and low-frequency local oscillator signals for a transceiver according to an aspect of the invention.

FIG. 8 shows two phase-locked loop (PLL) based frequency synthesizers PLL1 and PLL2 that can generate a high frequency local oscillator signal and a low frequency local oscillator signal for a mixer of a transmit front end and a receive subsystem of a transceiver. The loop filters and programmable charge pump currents allow adjustment of loop bandwidths and dynamics to suit the target application.

Each synthesizer contains a low-noise voltage controlled oscillator VCO1 811 and VCO2 813, respectively, fully programmable main dividers NDIV1 815 and NDIV2 817, respectively, and fully programmable reference dividers RDIV1 819 and RDIV2 821, respectively. PLL1 includes a fixed by-4-divider 823 and PLL2 includes a fixed by-2-divider 825. Two phase detectors are included: a phase detector 827 for PLL1 and a second phase detector 829 for PLL2. The two charge pumps are designated by reference numerals 831 and 833 for PLL1 and PLL2, respectively. Also included are lock detectors (not shown), calibration frequency counters (not shown), and operating point control voltage detectors for each PLL1 and PLL2.

PLL1 also contains a mixer subsystem that includes a mixer 835 and lowpass filter 837. The mixer mixes the outputs of the two VCOs and the low pass filter 837 passes the difference product to its output, rejecting the sum product. The mixer subsystem may be switched in or out of the circuit of PLL1 under control of the microcontroller by bias signals (not shown) to buffers C1, C2, and C3, respectively, on or off and switching a bias supply (also not shown) to the pre-scaler 823 in the opposite direction. The PLL2 output may further be disconnected or connected to the mixer subsystem by switching on or off the bias supply of a buffer C4. The switching of the mixer subsystem in or out of PLL1 allows PLL1 132 to switchably operate in two modes: normal mode and offset mode.

In normal mode, PLL1 operates in a straightforward manner similar to how PLL2 operates. The pre-scaler 823 is turned on and the mixer subsystem bias currents are turned off so that the signal fed to the main divider NDIV1 815 is the output of VCO1 811 divided by 8. In offset mode, no bias is supplied to the pre-scaler 823 and the mixer subsystem is switched into the PLL loop so that the signal fed to the main divider is the output of the mixer 835 and lowpass filter 837.

Figure 9:
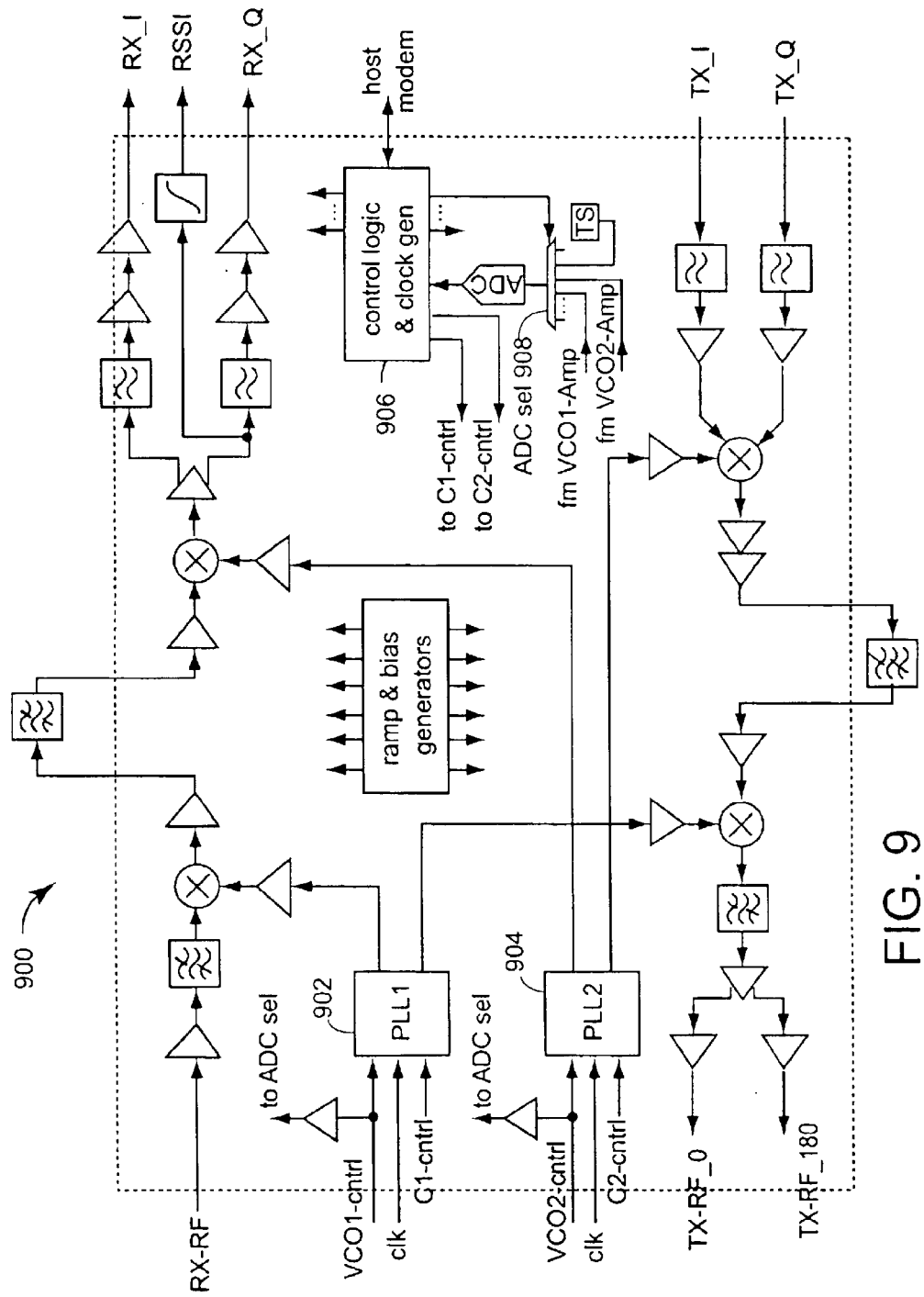
FIG. 9 shows a transceiver embodiment that includes implementations of two PLLs that include an embodiment of the calibration and operating point control described herein.

An example of a wireless transceiver in which the present invention may be used is described in U.S. patent Application Ser. No. 60/283,609, entitled WIRELESS COMMUNICATION SYSTEM, filed Apr. 13, 2001, and assigned to the assignee of the present invention. Such patent application is incorporated herein by reference. FIG. 9 shows one embodiment 900 of a transceiver that operates in the 5 GHz range and that includes implementations of two PLLs, PLL1 (902) and PLL2 (904), that include the inventive calibration and operating point control described herein.

Note that adding the calibration and the operating point control comes relatively "free" in a CMOS PLL circuit. Thus, the embodiments of the invention in CMOS use the fact that an analog circuit in CMOS provides relatively free processing power, and such processing power may be used to compensate and correct for the poor quality of the CMOS analog components.

It should be appreciated that although the invention has been described in the context of wireless transceivers, the invention is not limited to such contexts and may be utilized in various other applications and systems. Furthermore, the invention is not limited to any one type of PLL architecture.

It will be understood by those in the art that when an embodiment description uses the words maximum and minimum, the invention is not restricted to only the strict maximum and minimum values, respectively. That is, the words "minimum" and "maximum" as used herein broadly mean "very high" and "very low" values that, for example, are respectively higher and lower than any operating point, so the invention, when the words maximum and minimum are used, is not restricted to only the strict maximum and minimum values. In general two or more measurements are taken for calibration.

Furthermore, while the embodiments described herein use a voltage controlled oscillator, different frequency synthesizer embodiments may be constructed using in general a signal controlled oscillator (SCO). The signal may be a current, or a voltage, or some other signal, and how to modify the VCO embodiments to operate with some other signal controlled oscillator would be clear to those in the art, and is meant to be covered by the invention.

Thus, while there has been described what is believed to be the preferred embodiments of the invention, those skilled in the art will recognize that other and further modifications may be made thereto without departing from the spirit of the invention, and it is intended to claim Aall such changes and modifications as fall within the scope of the invention.

We claim:

1. A frequency synthesizer comprising:
   a phase locked loop including
      a signal controlled oscillator (SCO),
      a programmable frequency divider for dividing a signal from the SCO,
      a first controller to provide the divide ratio to said programmable divider,
      a reference source,
      a phase detector for comparing a signal from said reference source with an output signal of said divider and generating a phase detector signal related to the phase difference therebetween, and
      a loop filter for filtering the phase detector signal and providing a SCO control signal for controlling the frequency of said SCO;
   a frequency range controller coupled to the SCO that includes switchable elements, each providing a different frequency range of operation of the SCO under control of a switch input;
   a calibrator to relate the switch input to frequency ranges;
   a sensor coupled to the control signal of the SCO providing a measurement that varies as the magnitude of the control signal, said sensor having more than two output values that vary as the magnitude of the control signal; and
   a second controller accepting the magnitude indication and having an output coupled to the switch input of the range controller to maintain the operating point of the SCO close to a desired operating point.

2. A frequency synthesizer comprising:
   a phase locked loop including
      a signal controlled oscillator (SCO),
      means for dividing the frequency of a signal from the SCO,
      first control means for providing the divide ratio to said means for dividing,
      means for providing a reference source,
      means for comparing a signal from said reference source with an output signal of said means for dividing and for generating a phase detector signal related to the phase difference therebetween, and
      means for filtering the phase detector signal and providing a SCO control signal for controlling the frequency of said SCO;

means for controlling a frequency range, the frequency range controlling means coupled to the SCO that includes switchable elements, each providing a different frequency range of operation of the SCO under control of a switch input;

means for calibrating by relating the switch input to frequency ranges;

means for sensing coupled to the control signal of the SCO, the means for sensing providing an output of more than two values that vary as the magnitude of the control signal; and means for maintaining operating point of the SCO close to a desired operating point, the means for maintaining accepting the output of the means for sensing and having an output coupled to the switch input of the frequency range controlling means.

3. An apparatus to maintain a voltage-controlled oscillator (VCO) close to a desired operating point, the voltage-controlled oscillator (VCO) providing a variable frequency output that depends, in part on an analog control input signal, and in part on a capacitance connected to a capacitor input, the apparatus comprising:

a switchable bank of capacitors connected to said capacitor input and having a switch input to provide a selectable range of operating frequencies for the VCO;

a sensor connected to the control input of the VCO providing a measurement that varies as the magnitude of the control signal, the sensor providing an analog output; and a digital controller connected to the switch input and accepting the control signal magnitude indication, the controller accepting a digital input and providing control to the switchable capacitor bank to maintain the operating point of the VCO close to the desirable operating point;

a temperature sensor to provide an indication of temperature to the digital controller; and an analog to digital converter (ADC) to convert the analog sensor output to the magnitude indication accepted by the digital controller;

wherein the digital controller detects when the temperature changes by more than a temperature threshold and generates the control to the switchable capacitor bank when the temperature threshold is exceeded.

4. An apparatus to maintain a voltage controlled controlled oscillator (VCO) close to a desired operating point the voltage-controlled oscillator (VCO) providing a variable frequency output that depends, in part on an analog control input signal, and in part on a capacitance connected to a capacitor input, the apparatus comprising:

a switchable bank of capacitors connected to said capacitor input and having a switch input to provide a selectable range of operating frequencies for the VCO;

a sensor connected to the control input of the VCO providing a measurement that varies as the magnitude of the control signal, said sensor having more than two output values that vary as the magnitude of the control signal; and a controller connected to the switch input and accepting the control signal magnitude indication, the controller providing control to the switchable capacitor bank to maintain the operating point of the VCO close to the desirable operating point;

wherein said sensor includes a sense amplifier coupled to an analog to digital converter to provide a multi-bit digital signal.

* * * * *